United States Patent
Sugita et al.

(10) Patent No.: US 10,966,359 B2
(45) Date of Patent: Mar. 30, 2021

(54) BASE BOARD OPERATION SYSTEM

(71) Applicant: FUJI CORPORATION, Chiryu (JP)

(72) Inventors: Hiroyoshi Sugita, Kariya (JP); Yusuke Yamakage, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/614,574

(22) PCT Filed: Jun. 9, 2017

(86) PCT No.: PCT/JP2017/021456
§ 371 (c)(1),
(2) Date: Nov. 18, 2019

(87) PCT Pub. No.: WO2018/225242
PCT Pub. Date: Dec. 13, 2018

(65) Prior Publication Data
US 2020/0170152 A1    May 28, 2020

(51) Int. Cl.
| | | |
|---|---|---|
| *H05K 7/00* | (2006.01) | |
| *H05K 13/00* | (2006.01) | |
| *H05K 13/08* | (2006.01) | |
| *H05K 13/04* | (2006.01) | |

(52) U.S. Cl.
CPC ..... *H05K 13/0015* (2013.01); *H05K 13/0069* (2013.01); *H05K 13/041* (2018.08); *H05K 13/0812* (2018.08)

(58) Field of Classification Search
USPC ....................................................... 361/728
See application file for complete search history.

(56) References Cited

U.S. PATENT DOCUMENTS

| | | | | |
|---|---|---|---|---|
| 6,150,627 A | * | 11/2000 | Sugiyama | B23H 11/00 |
| | | | | 219/69.16 |
| 6,647,138 B1 | | 11/2003 | Sakaguchi | |

FOREIGN PATENT DOCUMENTS

| | | | |
|---|---|---|---|
| JP | 2003-234598 A | 8/2003 | |
| JP | 2004-39818 A | 2/2004 | |
| JP | 2010-272549 A | 12/2010 | |
| JP | 2014-120724 | * 6/2014 | ............. H05K 13/04 |
| JP | 2016-205957 A | 12/2016 | |

OTHER PUBLICATIONS

International Search Report dated Aug. 15, 2017 in PCT/JP2017/021456 filed on Jun. 9, 2017.

* cited by examiner

*Primary Examiner* — Hung S. Bui
(74) *Attorney, Agent, or Firm* — Oblon, McClelland, Maier & Neustadt, L.L.P.

(57) ABSTRACT

A board work system including ark arrangement members, on which are arranged multiple marks that have a specified relative positional relationship, are arranged straddling first work area in which first work head moves and second work area in which second work head moves, and, when performing work with respect to a board, which is a single board held by a board holding device in a state straddling the first work area and the second work area, based on positions of the marks in first work area measured based on image data of first imaging device that is moved along with the first work head and positions of the marks in second work area measured based on image data of second imaging device that is moved along with the second work head.

8 Claims, 5 Drawing Sheets

BASE BOARD OPERATION SYSTEM

TECHNICAL FIELD

Disclosed herein is a board work system having a work head and performing work on a board using the work head.

BACKGROUND ART

In patent literature 1 below, two component mounters, or board work machines, are arranged side by side and are configured such that board conveyance devices provided in each of the two component mounters can together fixedly hold a single board, and component mounting heads provided in each of the component mounters can both mount components on that single board. In other words, patent literature 1 below discloses a board work system that performs work on a single board using two work heads.

CITATION LIST

Patent Literature

Patent literature 1: JP-A-2004-39818

BRIEF SUMMARY

Problem to be Solved

In the board work system disclosed in patent literature 1 above, since two work heads are used for a single board, it is necessary to coordinate operations of each of the two work heads. For example, the relationship of the coordinate system for controlling the position on the board of each of the two work heads needs to be known. Considering this, it is an object of the present disclosure to appropriately coordinate operations of two work heads in a board work system where operations are performed with respect to a single board using two work heads.

Solution to Problem

To solve the above problems, disclosed herein is a board work system including: a mark arrangement member arranged straddling a first work area in which a first work head moves and a second work area in which a second work head moves, on which are arranged multiple marks that have a specified relative positional relationship, wherein the board work system is configured to, when performing work with respect to the board, which is a single board held by a board holding device in a state straddling the first work area and the second work area, based on (i) positions of the marks in the first work area measured based on image data of a first imaging device that is moved along with the first work head and (ii) positions of the marks in the second work area measured based on image data of a second imaging device that is moved along with the second work head and, during the work, correct at least one of a position to which to move the first work head by the first work head moving device and a position to which to move the second work head by the second work head moving device.

Effects

In a board work system of the present disclosure, a mark arrangement member is provided straddling the work areas of two works head, and the relative positions of the two work heads can be known by measuring the positions of multiple marks, which have a specified relative positional relationship, that are in each of the two areas using two imaging devices, such that the work position with respect to a single board can be made determined appropriately.

EMBODIMENTS

A board work system that is an embodiment of the present disclosure will be described with reference to the figures. In addition to the embodiments below, various modifications can be made to this disclosure based on the knowledge of someone skilled in the art.

Figure 1:
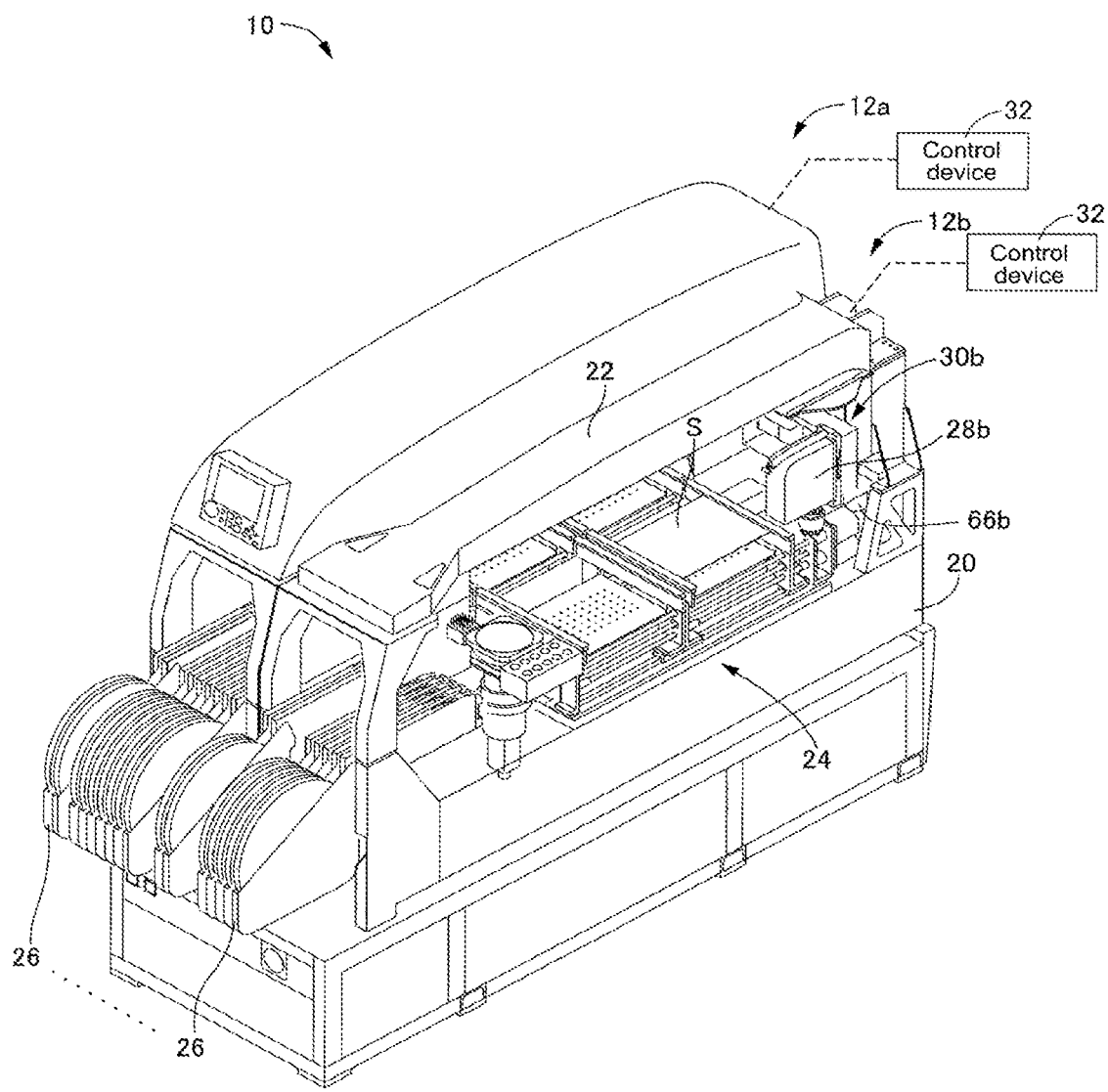
FIG. 1 is a perspective view of a portion of a component mounting system as a board work system of an embodiment.

FIG. 1 shows component mounting system 10 as a board work system of an embodiment. Note that, work of mounting components on a board involves mounting multiple types of components on a board, thus, component mounting system 10 is configured including multiple component mounters 12 as board work machines. FIG. 1 shows first component mounter 12a and second component mounter 12b, which are two of the multiple component mounters 12, with second component mounter 12b shown with exterior panels removed. In descriptions below, when items configuring first component mounter 12a and second component mounter 12b need to be distinguished from each other, the respective items are sometimes denoted by the suffixes a and b.

Component mounter 12 is configured including: base 20; beam 22 fixedly mounted on base 20; board conveyance device 24 mounted on base 20; multiple component feeders 26 interchangeably mounted on base 20 on the front side of component mounter 12; component mounting head 28 as a work head that picks up and holds a component supplied from any of the component feeders 26 and releases the component in order to mount the component on a board; head moving device 30 mounted on beam 22 for moving component mounting head 28 on a plane parallel to the board; and control device 32 for performing overall control of component mounter 12. Note that, in descriptions below, a direction in which the board is conveyed by board conveyance device 24 is referred to as a left-right direction (X direction), a direction perpendicular to the left-right direction on the horizontal plane is referred to as a front-rear direction (Y direction), and a direction perpendicular to the left-right direction and the front-rear direction is referred to as a vertical direction (Z direction).

Figure 2:
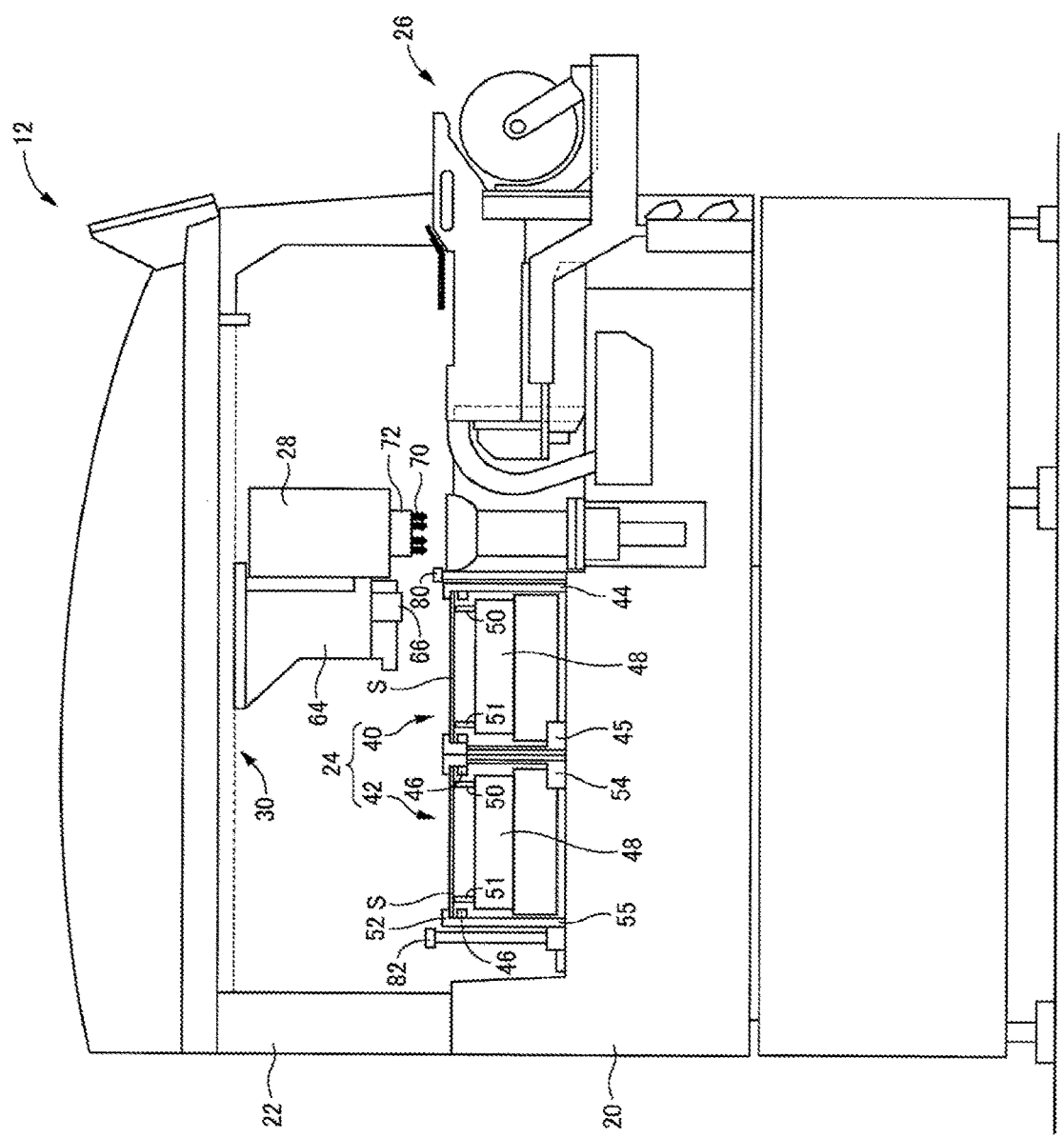
FIG. 2 is a side view of the component mounter shown in FIG. 1.

FIG. 2 is a side view of component mounter 12. As shown in FIG. 2, board conveyance device 24 is provided with two rows of conveyor devices, 40 and 42, arranged in a front-rear direction. Front conveyor device 40 has a pair of conveyors, 44 and 45, facing each other, and is structured such that a board loaded on conveyor belt 46 of each of the pair of conveyors 44 and 45 is conveyed in the left-right direction by rotating the conveyor belts 46 of each of the pair of conveyors 44 and 45 using a conveyance motor. Conveyor device 40 is configured such that rear conveyor 45 is movable back and forth relative to front conveyor 44 to accommodate boards of various widths. Also, conveyor device 40, by raising support table 48, support table 48 raises shutters 50 and 51, and the board is sandwiched and fixed between the shutters 50 and 51 and flange section 52 provided above each of the pair of conveyors 44 and 45. Further, rear conveyor device 42 is of substantially the same construction as front conveyor device 40 and has a pair of conveyors, 54 and 55, facing each other. However, both of the pair of conveyors 54 and 55 can be moved forward and backward.

Note that, by moving rear conveyor 45 of front conveyor device 40 and pair of conveyors 54 and 55 of rear conveyor device 42 to the rear side, it is possible to use only front conveyor device 40 as a single conveyor device. Accordingly, board conveyance device 24 is also capable of accommodating boards with relatively large widths.

Reels around which are wound component holding tapes (also referred to as "taped components", which are multiple components held in tape) are set on each of the multiple component feeders 26, and each of the multiple component feeders 26 feeds components one by one to a specified component supply position by intermittently feeding the component holding tape. Replenishment of components may be performed by exchanging reels and connecting taped components (splicing), or by exchanging the component feeder 26 complete with reel. Note that, instead of multiple component feeders 26, a so-called tray type component supply device may be attached to component mounter 12.

Figure 3:
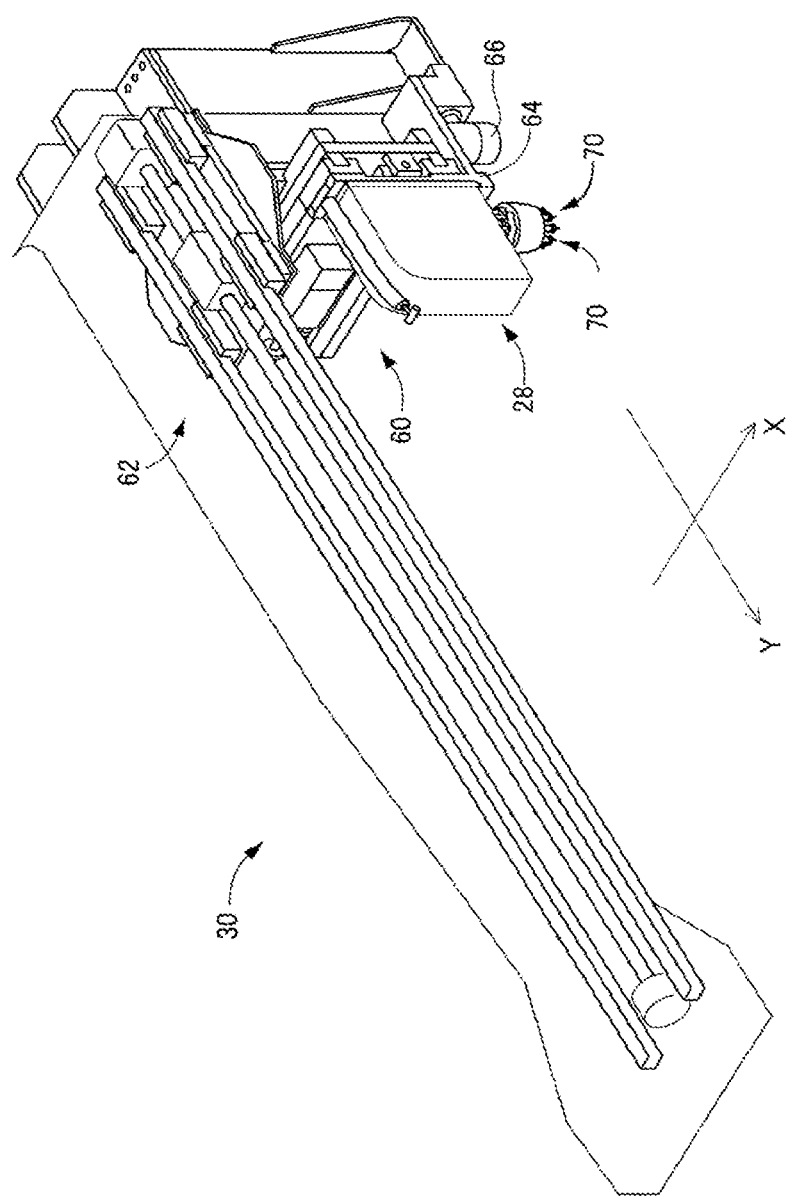
FIG. 3 is a perspective view of the head moving device provided in the component mounter shown in FIG. 1.

FIG. 3 shows a perspective view of head moving device 30. Head moving device 30 is a so-called XY-type moving device, and includes X-direction moving mechanism 60 for moving in the X direction, and Y-direction moving mechanism 62 for moving component mounting head 28 in the Y direction. In detail, Y-direction moving mechanism 62 is supported by beam 22 to move X-direction moving mechanism 60 to and from component feeders 26 and the board. X-direction moving mechanism 60 supports and moves in the X direction head attachment body 64 to which component mounting head 28 is removably attached. As shown in FIG. 3, camera 66 is fixed to a lower portion of head attachment body 64 as an imaging device for imaging surfaces of the board and the like.

Component mounting head 28 is a so-called index-type mounting head. That is, component mounting head 28 has eight suction nozzles 70, each of which picks up and holds a component at its lower end by the supply of negative pressure, with the suction nozzles 70 being held by revolver 72. Revolver 72 is intermittently rotated, and the suction nozzle 70 positioned at a specified position can be raised and lowered, that is, moved vertically, by a nozzle raising and lowering device. When the suction nozzle 70 at the specified position is lowered, negative pressure is supplied to pick up and hold the component, and the supply of negative pressure is canceled to release the component being held. Note that, each of the eight suction nozzles 70 is rotated about its own axis, that is, rotated with its axis line at the center of rotation, by a nozzle rotating mechanism, such that component mounting head 28 can change and adjust the rotational position of the components held by each suction nozzle 70. Note that, a so-called single-nozzle mounting head, that is, a head with just one suction nozzle, may be attached to head attachment body 64 as a component mounting head.

Outline of Component Mounting Work by Component Mounter

To briefly describe component mounting work by a single component mounter 12: first, a board to be worked on is loaded from the upstream side by board conveyance device 24, conveyed to a specified position, and fixed at a specified work position. Camera 66 is then moved by head moving device 30 and the fiducial marks on the top surface of the board are imaged. Based on the image data obtained by the imaging, a coordinate system serving as a reference for the mounting positions is determined. Head moving device 30 then positions component mounting head 28 over the multiple component feeders 26 and sequentially picks up and holds components using each of the eight suction nozzles 70. Then, head moving device 30 moves component mounting head 28 over the board and sequentially performs mounting at a set positions determined by a mounting program.

Figure 4:
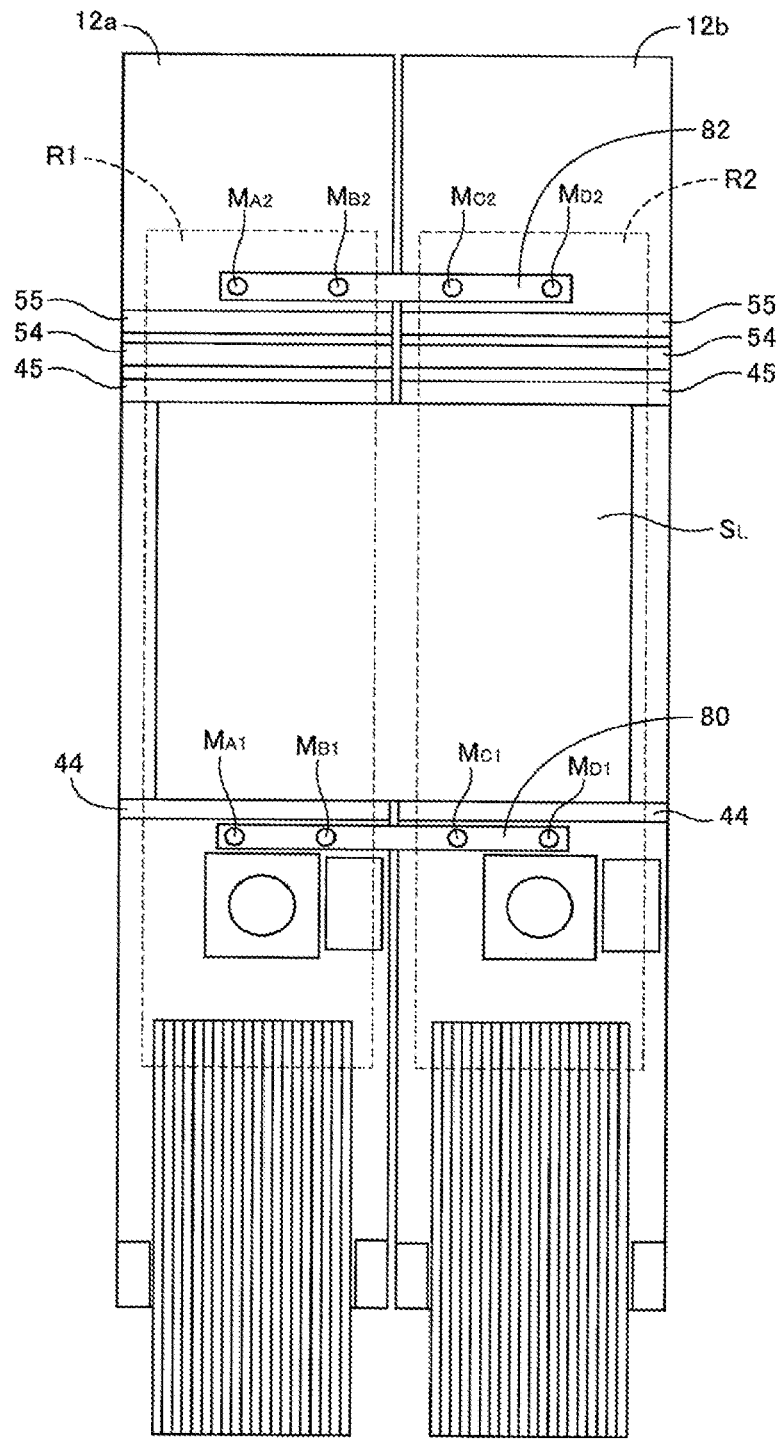
FIG. 4 is a plan view showing the inside of the component mounter in the component mounting system shown in FIG. 1.
Figure 5:
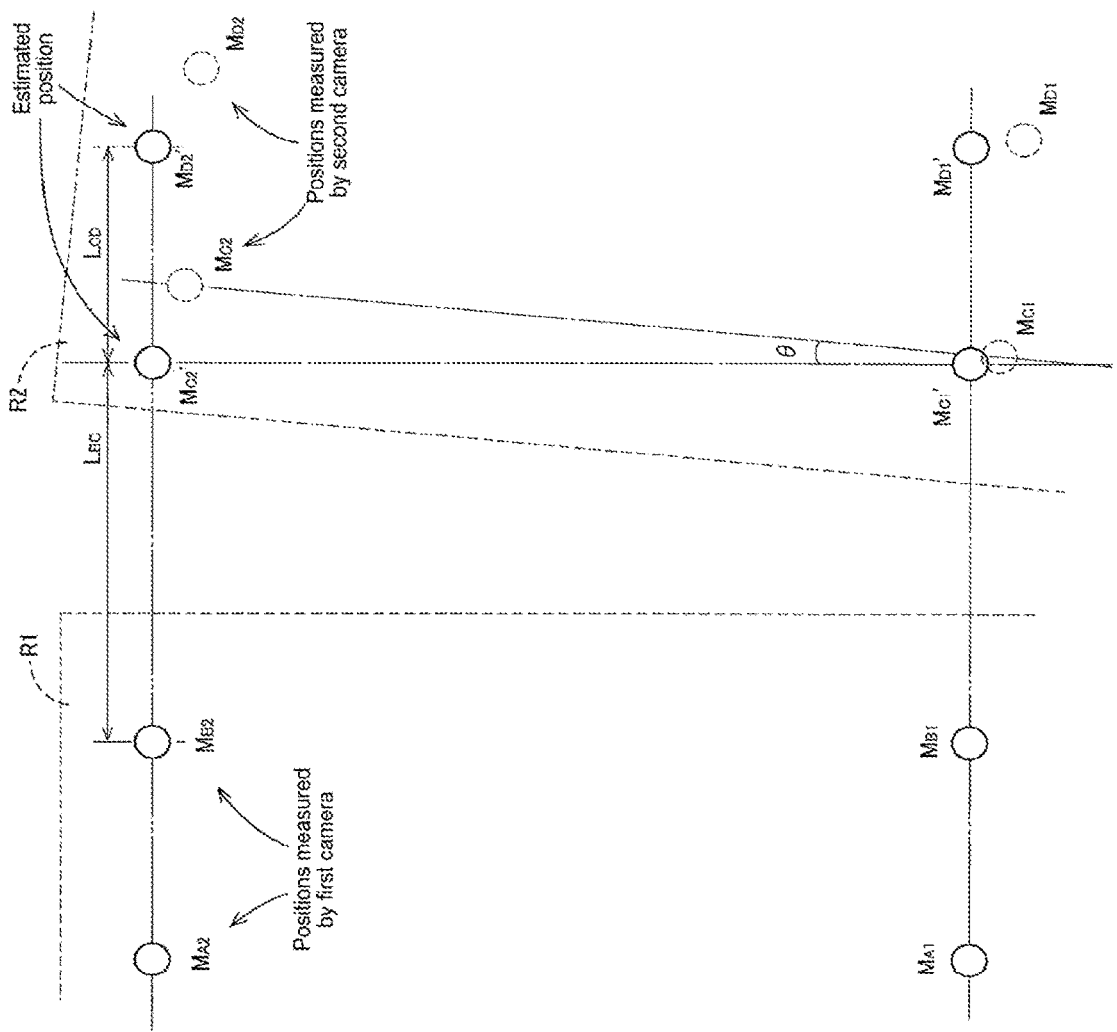
FIG. 5 schematically shows a deviation between an estimated position and a measured position of a mark arranged on the mark plate shown in FIG. 4.

Further, with component mounting system 10 of the present embodiment, as shown in the plan view of FIG. 4, one large board $S_L$ can be fixed and held by board conveyance device 24 of the two component mounters 12a and 12b, with the board conveyance device 24 of each of the two component mounters 12 acting as a single conveyor device. Further, with component mounting system 10 of the present embodiment, both first component mounter 12a and second component mounter 12b can perform a component mounting operation on the large board $S_L$. In descriptions below, component mounting head 28 of first component mounter 12a may be referred to as first mounting head 28a, and component mounting head 28 of second component mounter 12b may be referred to as second mounting head 28b.

As described above, with component mounting system 10, since two component mounting heads, 28a and 28b, are used for a single board $S_L$, the two mounting heads 28a and 28b need to cooperate with each other. Specifically, it is necessary to unify the coordinate system in a plane parallel to the board for moving first mounting head 28a using head moving device 30a and the coordinate system for moving second mounting head 28b using head moving device 30b.

When first work area R1 in which work is performed by first mounting head 28a and second work area R2 in which work is performed by second mounting head 28b overlap, for example, a mark serving as a reference may be provided at the overlapping portion, and the coordinate system of first mounting head 28a and the coordinate system of second mounting head 28b may be easily unified based on image data of the mark captured by camera 66 of first component mounter 12a (hereinafter, sometimes referred to as first camera 66a) and image data of the mark captured by camera 66 of the second component mounter 12b (hereinafter, sometimes referred to as second camera 66b).

However, in component mounting system 10, first work area R1 in which work is performed by first mounting head 28a and second work area R2 in which work is performed by second mounting head 28b do not overlap with each other, as shown in FIG. 4. Therefore, it is problematic to unify the coordinate system of first mounting head 28a and the coordinate system of second mounting head 28b. Described in detail below is a method of unifying the coordinate system of first mounting head 28a and the coordinate system of second mounting head 28b in component mounting system 10.

Component mounting system 10 includes a pair of mark plates, 80 and 82, on which are arranged multiple marks and which have a set relative positional relationship. Pair of mark plates 80 and 82 are identical, being formed in a rectangular shape from quartz glass, which has a low expansion coefficient, and four circular marks are arranged in a line on an upper surface of the mark plates 80 and 82. Further, the pair of mark plates 80 and 82 are arranged on base 20. Specifically, the pair of mark plates 80 and 82 are arranged extending in the left-right direction at the front side and the rear side of the board conveyance device 24, thus sandwiching board conveyance device 24. In descriptions below, mark plate 80 arranged at the front side of board conveyance device 24 is referred to as first plate 80, and mark plate 82 arranged at the rear side of board conveyance device 24 is referred to as second plate 82.

First plate 80 and second plate 82 are arranged straddling first component mounter 12a and second component mounter 12b, more specifically, straddling first work area R1 and second work area R2. Note that, first plate 80 and second plate 82 are arranged so that two marks are present in each of first work area R1 and second work area R2. In the following descriptions, the four marks of first plate 80 are denoted, from the left, as $M_{A1}$, $M_{B1}$, $M_{C1}$, and $M_{D1}$, and the four marks of second plate 82 are denoted, from the left, as $M_{A2}$, $M_{B2}$, $M_{C2}$, and $M_{D2}$.

When performing component mounting work on a large board S, first, in first component mounter 12a, marks $M_{A1}$ and $M_{B1}$ of first plate 80 and marks $M_{A2}$, $M_{B2}$ of second plate 82 are imaged by camera 66a. The position coordinates of marks $M_{A1}$, $M_{B1}$, $M_{A2}$, and $M_{B2}$ are measured based on the captured image data. The position coordinates of the four marks $M_{A1}$, $M_{B1}$, $M_{A2}$, and $M_{B2}$ measured before component mounting work are used as a reference for correcting thermal expansion and the like in first component mounter 12a. Then, at predetermined timing during component mounting work, the positional coordinates of the four marks $M_{A1}$, $M_{B1}$, $M_{A2}$, and $M_{B2}$ are measured again, and the positional coordinates are corrected in accordance with the thermal expansion based on differences from the positional coordinates used as the reference.

Further, in second component mounter 12b, similarly, marks $M_{C1}$ and $M_{D1}$ of first plate 80 and marks $M_{C2}$, and $M_{D2}$ of second plate 82 in second working area R2 are imaged by camera 66b. The position coordinates of marks $M_{C1}$ and $M_{D1}$ and marks $M_{C2}$ and $M_{D2}$ are measured based on the captured image data, and the measured position coordinates are used for correcting thermal expansion.

Next, based on the position coordinates of marks $M_{A1}$ and $M_{B1}$ and marks $M_{A2}$ and $M_{B2}$ measured at first component mounter 12a as described above, the position coordinates of marks $M_{C1}$ and $M_{D1}$ of first plate 80 and marks $M_{C2}$ and $M_{D2}$ of second plate 82 are estimated. As described above, in first plate 80 and second plate 82, the four marks $M_A$, $M_B$, $M_C$, and $M_D$ are arranged in a straight line. Further, the interval between marks $M_A$ and $M_B$, the interval between marks $M_B$ and $M_C$, the interval between marks $M_C$ and $M_D$ are each set to a predetermined interval, $L_{AB}$, $L_{BC}$, and $L_{CD}$ respectively. Accordingly, in component mounting system 10, when the position coordinates of marks $M_A$ and $M_B$ are measured, the position coordinates of marks $M_{C1}$ and $M_{D1}$ of first plate 80 and marks $M_{C2}$ and $M_{D2}$ of second plate 82 existing in second working area R2 can be easily estimated based on the measured position coordinates.

Continuing, based on the position coordinates of marks $M_{C1}$ and $M_{D1}$ of first plate 80 and the position coordinates of marks $M_{C2}$ and $M_{D2}$ of second plate 82 and the position coordinates measured at second component mounter 12b, the positional relationship of second component mounter 122b with respect to first component mounter can be obtained. Specifically, for each of mark $M_{C1}$ and $M_{D1}$ of first plate 80 and marks $M_{C2}$ and $M_{D2}$ of second plate 82 in second area R2, the estimated position coordinates and the measured position coordinates are compared, and the position of the second component mounter 12b with respect to first component mounter 12a, for example, the X-direction distance between these mounters and the Y-direction deviation are obtained. Also, the angle of second component mounter 12b with respect to first component mounter 12a is obtained based on angle $\theta_C$ with respect to the straight line through which marks $M_{C1}$ and $M_{C2}$ pass estimated from the straight line through which measured marks $M_{C1}$ and $M_{C2}$ pass, and angle $\theta_D$ with respect to the straight line through which marks $M_{D1}$ and $M_{D2}$ pass estimated from the straight line through which measured marks $M_{D1}$ and $M_{D2}$ pass. Further, when performing component mounting work with respect to large board $S_L$, in second component mounter 12b, the position to which to move second mounting head 28b using head moving device 30b is corrected based on the obtained position and angle of second component mounter 12b with respect to first component mounter 12a.

Note that, the positional relation of second component mounter 12b with respect to first component mounter 12a is repeatedly obtained at predetermined intervals in order to consider thermal expansion and the like during the component mounting work with respect to the large board $S_L$.

Note that, in component mounting system 10 of the present embodiment, the position to which second mounting head 28 is to be moved using head moving device 30b is corrected with reference to first component mounter 12a, but the position to which first mounting head 28a is to be moved by head moving device 30a may be corrected with reference to second component mounter 12b. Further, the position to which first mounting head 28a is to be moved using head moving device 30a and the position to which second mounting head 28b is to be moved using head moving device 30b may both be corrected.

Also, in component mounting system 10 of the present embodiment, in order to correct the thermal expansion of first component mounter 12a, as described above, the pair of mark plates 80 and 82 are arranged so that two circular marks are present in first working area R1. Thus, the directions in which mark plates 80 and 82 extend can be identified, and corrected can be performed in accordance with the thermal expansion of first component mounter 12a. Note that, the shape of the marks is not limited to a circular shape, and the number of marks is not limited to two. For example, a triangle or a quadrilateral mark may be used, and one mark or three marks or more may be used.

Further, in component mounting system 10 of the present embodiment, in order to perform correction in accordance with the thermal expansion of second component mounter 12, the pair of mark plates 80 and 82 are arranged so that two marks are present in second working area R2, as described above. However, similarly to a mark in first area R1, a mark in the second area R2 may be, for example, a triangular mark or a quadrilateral mark, and the number of marks may be one or three or more.

Further, although the board work system of the present embodiment is applied as a component mounting system provided with a component mounting head for mounting a component on a board as a work head, the configuration is not limited thereto, and various systems for performing work on a board may be applied, such as a system mainly composed of a dispenser, an inspection machine, or the like. Note also, although the board work system of the present embodiment is formed by adjacently arranging two component mounters 12 side by side, the present disclosure may also be applied to a device in which two work heads with different work areas are provided for a single base.

REFERENCE SIGNS LIST

10: component mounting system (board work system);
12a: first component mounter;
12b: second component mounter;
20: base;
22: beam;
24: board conveyance device (board holding device);
26: component feeder;
28a: first mounting head (first work head);
28b: second mounting head (second work head);
30a: head moving device (first head moving device);
30b: head moving device (second head moving device);
66a: camera (first imaging device);
66b: camera (second imaging device);
80: mark plate (first plate) (mark arrangement member);
82: mark plate (second plate) (mark arrangement member)

The invention claimed is:

1. A board work system comprising:
a board holding device configured to fixedly hold a board;
a first work head and a second head each configured to perform work with respect to the board held by the board holding device;
a first head moving device configured to move the first work head in a first work area;
a second head moving device configured to move the second work head in a second work area that does not overlap the first work area, the first work area and the second work area separated by a predetermined distance in an X direction of board work system;
a first imaging device configured to be moved by the first head moving device along with the first work head;
a second imaging device configured to be moved by the second head moving device along with the second work head;
a mark arrangement member arranged straddling the first work area and the second work area on which are arranged multiple marks that have a specified relative positional relationship,
wherein the board work system is configured to, when performing work with respect to the board, which is a single board held by the board holding device in a state straddling the first work area and the second work area, use the first imaging device to image at least one of the marks of the mark arrangement member that is in the first work area and measure the positions of the imaged at least one marks in the first work area, use the second imaging device to image at least one of the marks of the mark arrangement member that is in the second work area and measure the positions of the imaged at least one marks in the second work area, and, based on the measured positions of the marks in the first work area and the second area, during the work, correct at least one of a position to which to move the first work head by the first work head moving device and a position to which to move the second work head by the second work head moving device.

2. The board work system according to claim 1, further configured to estimate a position of the at least one mark of the mark arrangement member that is in the second work area based on the measured position of the mark in the first work area, and,
during the work, correct at least one of the position to which to move the first work head by the first work head moving device and the position to which to move the second work head by the second work head moving device based on a deviation between the estimated position and the measured position of the mark in the second work area.

3. The board work system according to claim 1, further comprising:
two board work machines arranged side by side in the X direction and each including (A) a base, (B) the board holding device arranged on the base and configured to convey and fixedly hold the board, (C) the work head configured to perform work on the board, (D) the head moving device configured to move the work head above the base, and (E) the imaging device configured to be moved by the head moving device along with the work head, wherein
the board holding device is configured by the board holding devices of each of the two board work machines being configured to fixedly hold a single board,
the work head, the head moving device, and the imaging device of one of the two board work machines are configured to function respectively as a first work head, a first head moving device, and a first imaging device,
the work head, the head moving device, and the imaging device of the other of the two board work machines are configured to function respectively as a second work head, a second head moving device, and a second imaging device, and
the mark arrangement member is arranged straddling the bases of each of the two board work machines.

4. The board work system according to claim 1, wherein the mark arrangement member is configured such that at least two of the marks are arranged in the first work area.

5. The board work system according to claim 1, wherein the mark arrangement member is configured such that at least two of the marks are arranged in the second work area.

6. The board work system according to claim 1, wherein the mark arrangement member is configured such that the multiple marks are arranged on a straight line, and
the board work system is provided with a pair of the mark arrangement members, and the pair of mark arrangement members is arranged with a gap along a direction crossing the straight line along which the multiple marks are arranged.

7. The board work system according to claim 6, wherein the pair of mark arrangement members are arranged so as to sandwich the board holding device.

8. The board work system according to claim 6, wherein each of the pair of mark arrangement members is configured such that four of the marks are arranged in a straight line in the X direction, with two of the marks being in the first work area and the other two of the marks being in the second work area.

* * * * *